United States Patent
Rodriguez-Latorre et al.

(10) Patent No.: US 10,153,025 B2
(45) Date of Patent: Dec. 11, 2018

(54) CIRCUIT AND METHOD FOR IMPRINT REDUCTION IN FRAM MEMORIES

(71) Applicant: Texas Instruments Incorporated, Dallas, TX (US)

(72) Inventors: Jose A. Rodriguez-Latorre, Dallas, TX (US); Hugh P. McAdams, McKinney, TX (US); Manish Goel, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 7 days.

(21) Appl. No.: 15/710,971

(22) Filed: Sep. 21, 2017

(65) Prior Publication Data

US 2018/0012642 A1 Jan. 11, 2018

Related U.S. Application Data

(60) Continuation of application No. 14/846,350, filed on Sep. 4, 2015, now Pat. No. 9,799,389, which is a division of application No. 14/252,551, filed on Apr. 14, 2014, now Pat. No. 9,361,965.

(60) Provisional application No. 61/950,351, filed on Mar. 10, 2014.

(51) Int. Cl.
*G11C 11/22* (2006.01)
*G06F 11/10* (2006.01)
(Continued)

(52) U.S. Cl.
CPC ...... *G11C 11/2275* (2013.01); *G06F 11/1008* (2013.01); *G06F 11/1068* (2013.01);
(Continued)

(58) Field of Classification Search
CPC .... G11C 11/221; G11C 11/2275; G11C 29/52
See application file for complete search history.

(56) References Cited

U.S. PATENT DOCUMENTS 6,141,237 A * 10/2000 Eliason .................. G11C 11/22
365/145
6,473,330 B1 * 10/2002 Ogiwara ................ G11C 11/22
365/145

(Continued)

OTHER PUBLICATIONS

Kumar et al.; "Impact of NBTI on SRAM Read Stability and Design for Reliability," 7th International Symposium on Quality Electronic Design (ISQED 2006).

*Primary Examiner* — Khamdan N. Alrobaie
(74) *Attorney, Agent, or Firm* — Kenneth Liu; Charles A. Brill; Frank D. Cimino (57) ABSTRACT

Disclosed embodiments include a memory device having a memory array that includes a first memory cell coupled to a first bit line and a second memory cell coupled to a second bit line and a sense amplifier that includes first and second transistors arranged in a cross-coupled configuration with third and fourth transistors, the first and second transistors being of a first conductivity type and the third and fourth transistors being of a second conductivity type, a first inverter having an input coupled to a first common drain terminal of the first and third transistors and an output coupled to the first bit line, and a second inverter having an input coupled to a second common drain terminal of the second and fourth transistors and an output coupled to the second bit line.

20 Claims, 9 Drawing Sheets

(51) Int. Cl.
  *G11C 29/52* (2006.01)
  *H03M 13/29* (2006.01)
  *G11C 29/04* (2006.01)

(52) U.S. Cl.
  CPC ........ *G11C 11/221* (2013.01); *G11C 11/2273* (2013.01); *G11C 29/52* (2013.01); *H03M 13/2945* (2013.01); *G11C 2029/0411* (2013.01)

(56) References Cited

U.S. PATENT DOCUMENTS

| | | | | |
|---|---|---|---|---|
| 6,590,798 | B1* | 7/2003 | Komatsuzaki | G11C 11/22 365/145 |
| 6,757,206 | B2* | 6/2004 | McAdams | G11C 7/06 365/145 |
| 6,785,629 | B2* | 8/2004 | Rickes | G11C 29/02 365/145 |
| 8,811,057 | B1 | 8/2014 | Madan et al. | |
| 2003/0112651 | A1 | 6/2003 | Basceri et al. | |
| 2007/0022360 | A1 | 1/2007 | Rai et al. | |
| 2009/0172496 | A1* | 7/2009 | Roine | G06F 11/1008 714/758 |
| 2009/0201756 | A1* | 8/2009 | Aipperspach | G11C 7/062 365/205 |
| 2012/0147654 | A1* | 6/2012 | Qidwai | G11C 11/22 365/145 |
| 2014/0129884 | A1* | 5/2014 | Hess | G11C 29/50012 714/721 |

* cited by examiner

| LOGIC STATE | $B_i$ | $B_0$ | $B_1$ | $b_i$ | $b_0$ | $b_1$ | $RB_0$ | $RB_1$ |
|---|---|---|---|---|---|---|---|---|
| AFTER WRITE | 0 | 0 | 1 | X | X | X | X | X |
| AFTER 1ST READ | 1 | 1 | 0 | 0 | 0 | 1 | 0 | 1 |
| AFTER 2ND READ | 0 | 0 | 1 | 1 | 1 | 0 | 0 | 1 |
| AFTER 3RD READ | 1 | 1 | 0 | 0 | 0 | 1 | 0 | 1 |
| AFTER 4TH READ | 0 | 0 | 1 | 1 | 1 | 0 | 0 | 1 |

CIRCUIT AND METHOD FOR IMPRINT REDUCTION IN FRAM MEMORIES

CROSS-REFERENCE TO RELATED APPLICATIONS

This application is related to U.S. patent application Ser. No. 14/051,946, filed Nov. 11, 2013, now U.S. Pat. No. 8,811,057. In addition this application is a continuation of U.S. patent application Ser. No. 14/846,350 filed Sep. 4, 2015, now U.S. Pat. No. 9,799,389, which in turn is a divisional of U.S. patent application Ser. No. 14/252,551 filed Apr. 14, 2014, now U.S. Pat. No. 9,361,965, which claims priority to U.S. Provisional Patent Application No. 61/950,351 filed Mar. 10, 2014. The contents of all are incorporated herein by reference in their entirety.

BACKGROUND OF THE INVENTION

Nonvolatile memory circuits such as electrically erasable programmable read only memories (EEPROM) and Flash EEPROMs have been widely used for several decades in various circuit applications including computer memory, automotive applications, and video games. Each of these nonvolatile memory circuits has at least one nonvolatile memory element such as a floating gate, silicon nitride layer, programmable resistance, or other nonvolatile memory element that maintains a data state when an operating voltage is removed. Many new applications, however, require the access time and packing density of previous generation nonvolatile memories in addition to low power consumption for battery powered circuits. One nonvolatile memory technology that is particularly attractive for these low power applications is the ferroelectric memory cell, which uses a ferroelectric capacitor for a nonvolatile memory element. A major advantage of these ferroelectric memory cells is that they require approximately three orders of magnitude less energy for write operations than previous generation floating gate memories. Furthermore, they do not require high voltage power supplies for programming and erasing charge stored on a floating gate. Thus, circuit complexity is reduced and reliability increased.

The term ferroelectric is something of a misnomer, since present ferroelectric capacitors contain no ferrous material. Typical ferroelectric capacitors include a dielectric of ferroelectric material formed between two closely-spaced conducting plates. One well-established family of ferroelectric materials known as perovskites has a general formula $ABO_3$. This family includes Lead Zirconate Titanate (PZT) having a formula $Pb(Zr_xTi_{1-x})O_3$. This material is a dielectric with a desirable characteristic that a suitable electric field will displace a central atom of the lattice. This displaced central atom, either Titanium or Zirconium, remains displaced after the electric field is removed, thereby storing a net charge. Another family of ferroelectric materials is Strontium Bismuth Titanate (SBT) having a formula $SbBi_2Ta_2O_9$. SBT has several advantages over PZT. Memories fabricated from either ferroelectric material have a destructive read operation. In other words, the act of reading a memory cell destroys the stored data so that it must be rewritten before the read operation is terminated.

Figure 1:
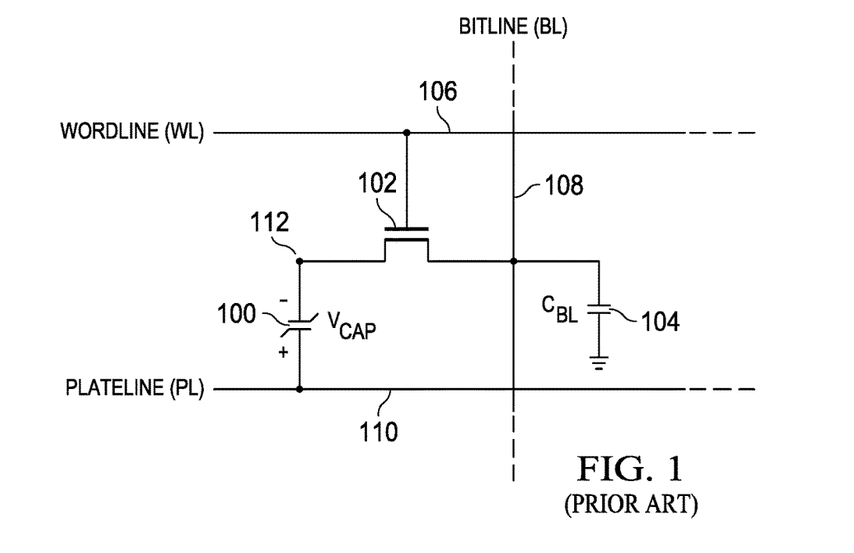
FIG. 1 is a circuit diagram of a ferroelectric memory cell of the prior art.

A typical one-transistor, one-capacitor (1T1C) ferroelectric memory cell of the prior art is illustrated at FIG. 1. The ferroelectric memory cell is similar to a 1T1C dynamic random access memory (DRAM) cell except for ferroelectric capacitor 100. The ferroelectric capacitor 100 is connected between plate line 110 and storage node 112. Access transistor 102 has a current path connected between bit line 108 and storage node 112. A control gate of access transistor 102 is connected to word line 106 to control reading and writing of data to the ferroelectric memory cell. This data is stored as a polarized charge corresponding to cell voltage $V_{CAP}$. Capacitance of bit line BL is represented by capacitor $C_{BL}$ 104.

Figure 2:
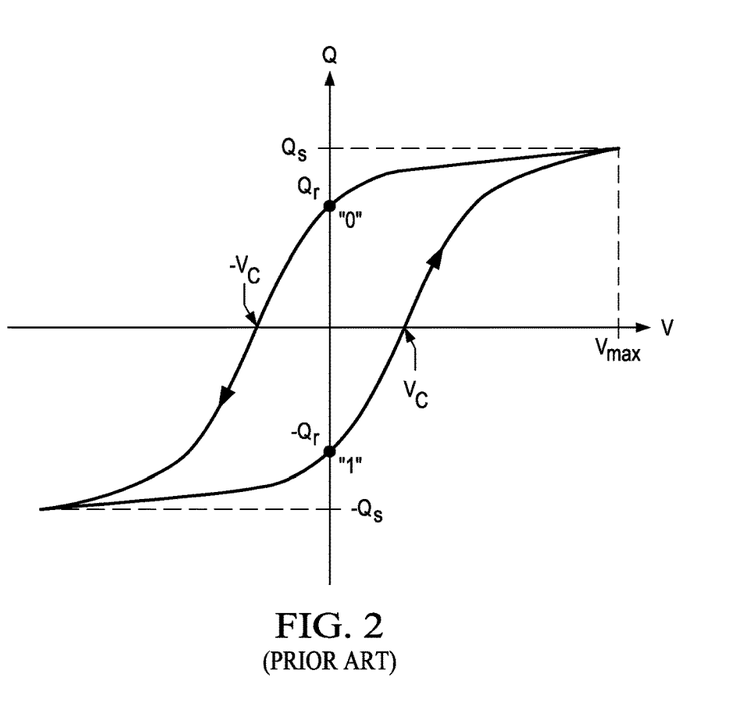
FIG. 2 is a hysteresis curve of the ferroelectric capacitor 100 of FIG. 1.

Referring to FIG. 2, there is a hysteresis curve corresponding to the ferroelectric capacitor 100. The hysteresis curve includes net charge Q or polarization along the vertical axis and applied voltage along the horizontal axis. By convention, the polarity of the ferroelectric capacitor voltage is defined as shown in FIG. 1. A stored "0", therefore, is characterized by a positive voltage at the plate line terminal with respect to the access transistor terminal. A stored "1" is characterized by a negative voltage at the plate line terminal with respect to the access transistor terminal. A "0" is stored in a write operation by applying a voltage Vmax across the ferroelectric capacitor. This stores a saturation charge Qs in the ferroelectric capacitor. The ferroelectric capacitor, however, includes a linear component in parallel with a switching component. When the electric field is removed, therefore, the linear component discharges, but the residual charge Qr remains in the switching component. The stored "0" is rewritten as a "1" by applying –Vmax to the ferroelectric capacitor. This charges the linear and switching components of the ferroelectric capacitor to a saturation charge of –Qs. The stored charge reverts to –Qr when the voltage across the ferroelectric capacitor is removed. Coercive points $V_C$ and $-V_C$ are minimum voltages on the hysteresis curve that will degrade a stored data state. For example, application of $V_C$ across a ferroelectric capacitor will degrade a stored "1" even though it is not sufficient to store a "0". Thus, it is particularly important to avoid voltages near these coercive points unless the ferroelectric capacitor is being accessed. Moreover, power supply voltage across a ferroelectric capacitor must exceed these coercive voltages during a standby or sleep mode avoid data loss.

Figure 3:
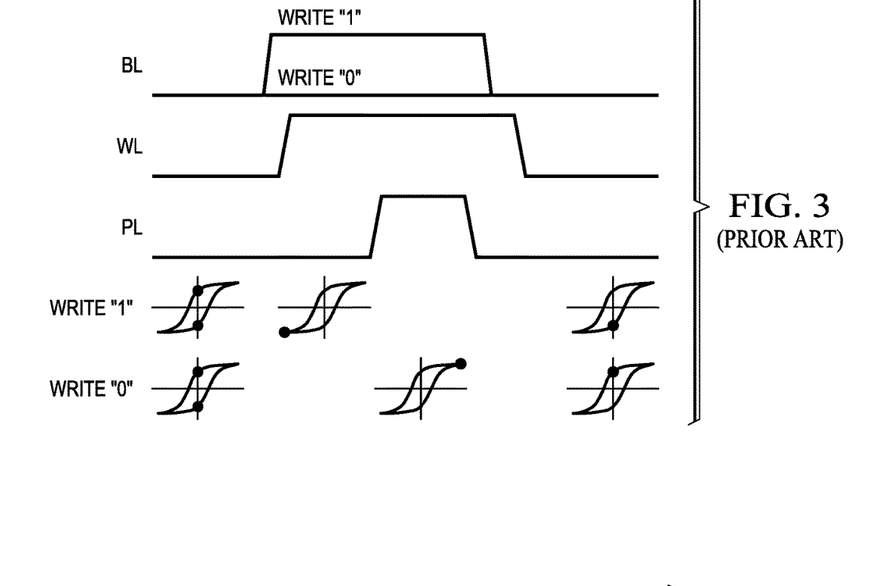
FIG. 3 is a timing diagram showing a write operation to the ferroelectric memory cell of FIG. 1.

Referring to FIG. 3, there is illustrated a typical write sequence for a ferroelectric memory cell as in FIG. 1. Initially, the bit line (BL), word line (WL), and plate line (PL) are all low. The upper row of hysteresis curves illustrates a write "1" and the lower row represents a write "0". Either a "1" or "0" is initially stored in each exemplary memory cell. The write "1" is performed when the bit line BL and word line WL are high and the plate line PL is low. This places a negative voltage across the ferroelectric capacitor and charges it to –Qs. When plate line PL goes high, the voltage across the ferroelectric capacitor is 0 V, and the stored charge reverts to –Qr. At the end of the write cycle, both bit line BL and plate line PL go low and stored charge –Qr remains on the ferroelectric capacitor. Alternatively, the write "0" occurs when bit line BL remains low and plate line PL goes high. This places a positive voltage across the ferroelectric capacitor and charges it to Qs representing a stored "0". When plate line PL goes low, the voltage across the ferroelectric capacitor is 0 V, and the stored charge reverts to Qr representing a stored "0".

Figure 4:
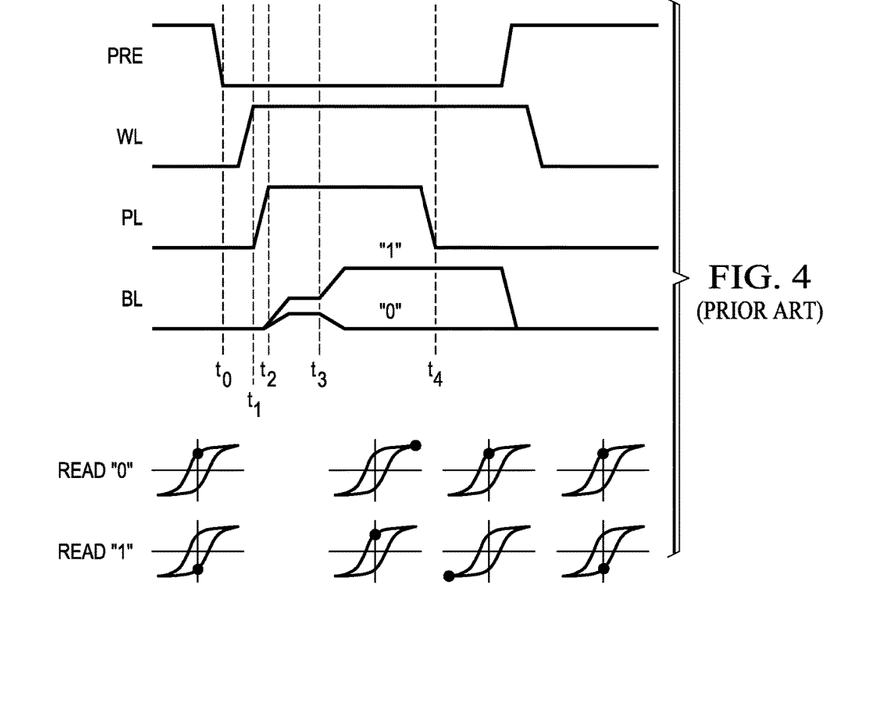
FIG. 4 is a timing diagram showing a read operation from the ferroelectric memory cell of FIG. 1.

A read operation is illustrated at FIG. 4 for the ferroelectric memory cell at FIG. 1. The upper row of hysteresis curves illustrates a read "0". The lower row of hysteresis curves illustrates a read "1". Word line WL and plate line PL are initially low. Bit lines BL are precharged low. At time $t_0$ bit line precharge signal PRE goes low, permitting the bit lines BL to float. At time $t_1$ word line WL goes high and at time $t_2$ plate line PL goes high. This permits each memory cell to share charge with a respective bit line. A stored "1"

will share more charge with parasitic bit line capacitance $C_{BL}$ and produce a greater bit line voltage than the stored "0" as shown at time $t_3$. A reference voltage (not shown) is produced at each complementary bit line of an accessed bit line. This reference voltage is between the "1" and "0" voltages. Sense amplifiers are activated at time $t_3$ to amplify the difference voltage between the accessed bit line and the complementary bit line. When respective bit line voltages are fully amplified, the read "0" curve cell charge has increased from Qr to Qs. By way of comparison, the read "1" data state has changed from a stored "1" to a stored "0". Thus, the read "0" operation is nondestructive, but the read "1" operation is destructive. At time $t_4$, plate line PL goes low and applies −Vmax to the read "1" cell, thereby storing −Qs. At the same time, zero voltage is applied to the read "0" cell and charge Qr is restored. At the end of the read cycle, signal PRE goes high and precharges both bit lines BL to zero volts or ground. Thus, zero volts is applied to the read "1" cell and −Qr is restored.

Figure 5:
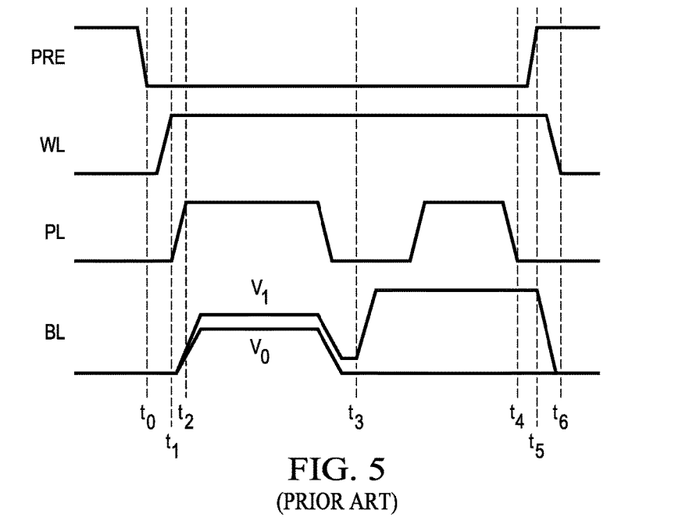
FIG. 5 is a timing diagram of a pulse sense read cycle.

Referring now to FIG. 5, a pulse sensing read operation is illustrated for a ferroelectric memory circuit. The read operation begins at time $t_0$ when precharge signal PRE goes low, permitting the bit lines BL to float. Word line WL and plate line PL are initially low, and bit lines BL are precharged low. At time $t_1$, word line WL goes high, thereby coupling a ferroelectric capacitor to a respective bit line. Then plate line PL goes high at time $t_2$, thereby permitting each memory cell to share charge with the respective bit line. The ferroelectric memory cells share charge with their respective bit lines BL and develop respective difference voltages. Here, $V_1$ represents a data "1" and $V_0$ represents a data "0". Plate line PL then goes low prior to time $t_3$, and the common mode difference voltage goes to near zero. The difference voltage available for sensing is the difference between one of $V_1$ and $V_0$ at time $t_3$ and a reference voltage (not shown) which lies approximately midway between voltages $V_1$ and $V_0$ at time $t_3$. The difference voltage is amplified at time $t_3$ by respective sense amplifiers and full bit line BL voltages are developed while the plate line PL is low. Thus, the data "1" cell is fully restored while plate line PL is low and the data "1" bit line BL is high. Subsequently, the plate line PL goes high while the data "0" bit line BL remains low. Thus, the data "0" cell is restored. The plate line PL goes low at time $t_4$, and precharge signal PRE goes high at time $t_5$. The high level of precharge signal PRE precharges the bit lines to ground or Vss. The word line WL goes low at time $t_6$, thereby isolating the ferroelectric capacitor from the bit line and completing the pulse sensing cycle.

Each of the foregoing read, write, and restore operations of the ferroelectric memory induce retained polarization domains within the ferroelectric capacitor 100. This is particularly true when a maximum electric field is applied to the ferroelectric capacitor at +/− Vmax. This phenomenon is often referred to as imprinting and may degrade the memory cell (FIG. 1) signal margin when reading an opposite data state. For example, when a "0" is frequently written to the memory cell followed by writing a "1", residual charge may remain more positive than −Qr (FIG. 2), thereby degrading the "1" signal margin. Likewise, when a "1" is frequently written to the memory cell followed by writing a "0", residual charge may remain more negative than Qr, thereby degrading the "0" signal margin. The present invention is directed to avoiding these and other disadvantages as will be discussed in detail.

BRIEF SUMMARY OF THE INVENTION

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

In accordance with one aspect of the disclosure, a memory device includes a memory array with a first memory cell coupled to a first bit line and a second memory cell coupled to a second bit line. The memory device also includes a sense amplifier having first and second transistors arranged in a cross-coupled configuration with third and fourth transistors, the first and second transistors being of a first conductivity type and the third and fourth transistors being of a second conductivity type. The sense amplifier includes a first inverter having an input coupled to a first common drain terminal of the first and third transistors and an output coupled to the first bit line and a second inverter having an input coupled to a second common drain terminal of the second and fourth transistors and an output coupled to the second bit line.

In accordance with another aspect of the disclosure, a method of operating a memory device having a memory array including a plurality of memory cells corresponding to a plurality of bits includes, for each time a read command is received requesting that a read operation be performed on the plurality of bits, reading data stored in the plurality of bits, reading a value of a signal bit associated with the plurality of bits, outputting read bits, the read bits corresponding to the data when the value of the signal bit indicates a first value and corresponding to the inverse of the data when the value of the signal bit indicates a second value, unconditionally writing the inverse of the data to the plurality of bits and the inverse of the signal bit value to the signal bit.

DETAILED DESCRIPTION OF THE INVENTION

Preferred embodiments of the present invention provide significant advantages in imprint reduction of a memory circuit. Embodiments of the present invention may be applied to any memory circuit such as static random access memory circuits, resistive random access memory circuits, magnetic random access memory circuits, or any other memory circuit that may develop a biased signal margin after multiple asymmetric read or write operations.

Figure 6A:
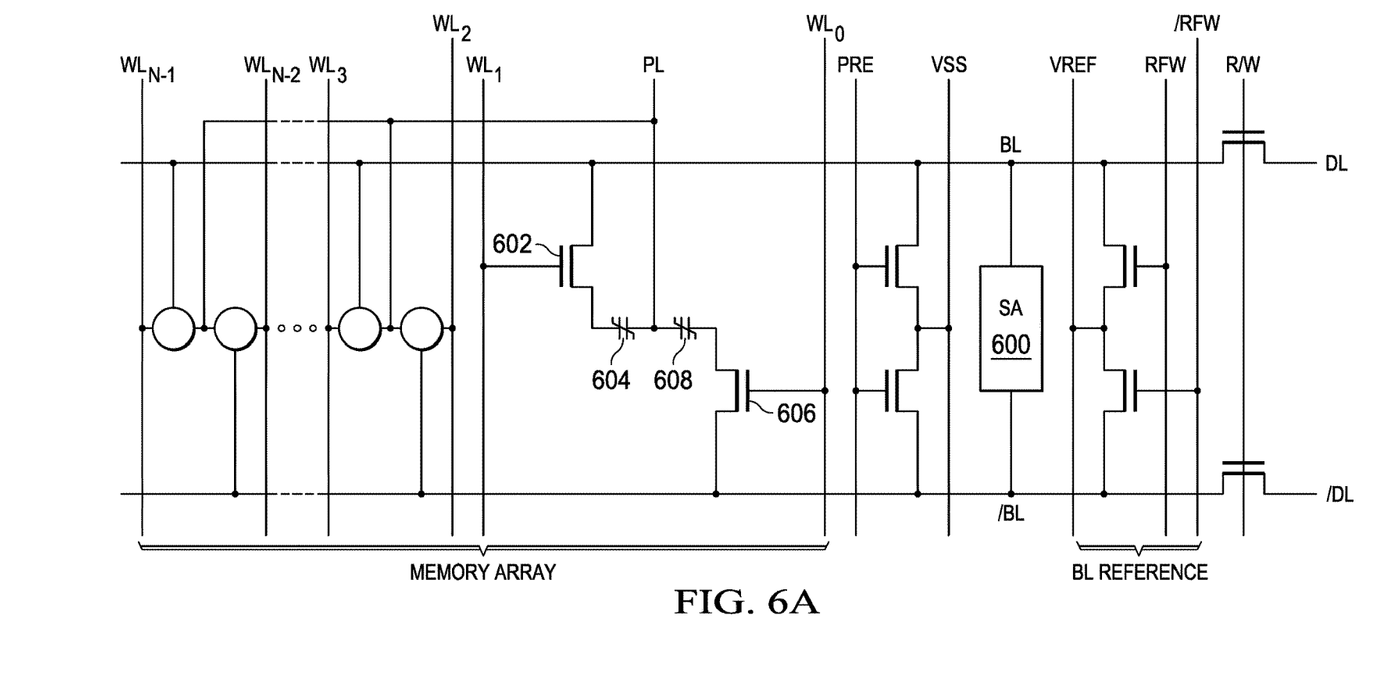
FIG. 6A is a schematic diagram of a column of 1T1C ferroelectric memory cells of the present invention.

Referring to FIG. 6A, there is a schematic diagram of a column of one-transistor, one-capacitor (1T1C) ferroelectric memory cells according to a first embodiment of the present invention. A ferroelectric memory array includes plural columns of memory cells arranged in parallel. The memory array also includes plural rows of memory cells defined by N parallel word lines $WL_0$ through $WL_{N-1}$. The memory cells are arranged in pairs and coupled to adjacent word lines and complementary bit lines BL and /BL. For example, word line $WL_0$ is connected to a control terminal of access transistor 606. Access transistor 606 has a current path coupled between complementary bit line /BL and ferroelectric capacitor 608. Ferroelectric capacitor 608 is coupled to a common plate line terminal PL. Word line $WL_1$ is connected to a control terminal of access transistor 602. Access transistor 602 has a current path coupled between bit line BL and ferroelectric capacitor 604. Ferroelectric capacitor 604 is also coupled to a common plate line terminal PL. The column further includes a bit line precharge circuit having two n-channel transistors arranged to precharge bit lines BL and /BL to VSS or ground in response to a high level of precharge signal PRE.

A bit line reference circuit is arranged to apply voltage VREF to one of bit lines BL and /BL during a read operation. For example, if a memory cell connected to bit line BL is selected, complementary bit line /BL receives reference voltage VREF in response to a high level of control signal /RFW. Likewise, if a memory cell connected to bit line /BL is selected, bit line BL receives reference voltage VREF in response to a high level of control signal RFW. Sense amplifier 600 amplifies a difference voltage between bit lines BL and /BL during a read operation in response to control signals SAEN and /SAEN (not shown in FIG. 6A). These control signals activate sense amplifier 600 which applies the amplified data signal to data lines DL and /DL via n-channel read/write transistors in response to a high level of control signal R/W.

Figure 6B:
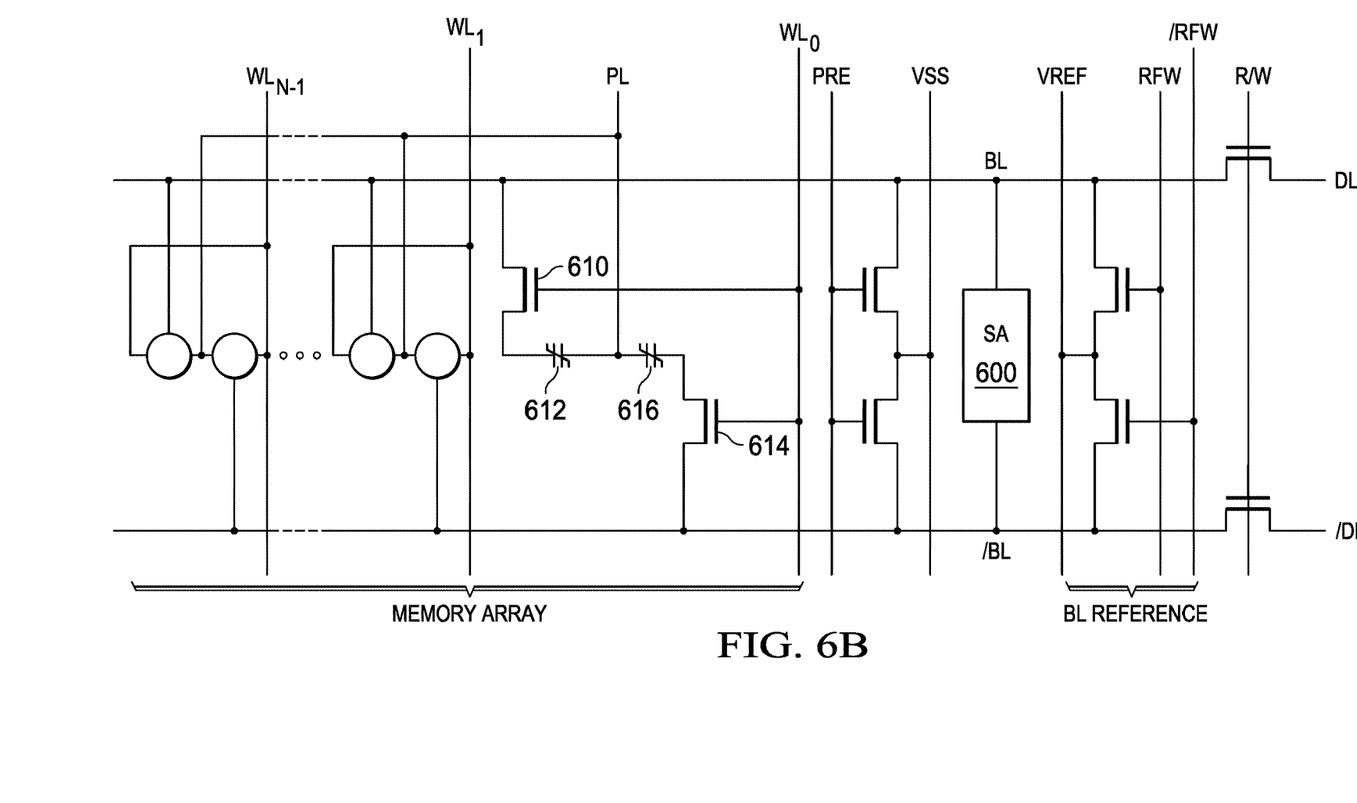
FIG. 6B is a schematic diagram of a column of 2T2C ferroelectric memory cells of the present invention.

FIG. 6B, is a schematic diagram of a column of two-transistor, two capacitor (2T2C) ferroelectric memory cells according to a second embodiment of the present invention. Here and in the following discussion, the same reference numerals are used to indicate substantially the same elements. A ferroelectric memory array includes plural columns of memory cells arranged in parallel. The memory array also includes plural rows of memory cells defined by N parallel word lines $WL_0$ through $WL_{N-1}$. In the 2T/2C embodiment, the memory cells are arranged in pairs and coupled to a respective word line and complementary bit lines BL and /BL. For example, word line $WL_0$ is connected to control terminals of access transistors 610 and 614. Access transistor 610 has a current path coupled between bit line BL and ferroelectric capacitor 612. Access transistor 614 has a current path coupled between complementary bit line /BL and ferroelectric capacitor 616. Ferroelectric capacitors 612 and 616 are coupled to a common plate line terminal PL. During a read operation, charge on each of ferroelectric capacitors 612 and 616 is applied to respective bit lines BL and /BL via access transistors 610 and 614, thereby providing a greater signal margin than the 1T1C memory cell.

Figure 7A:
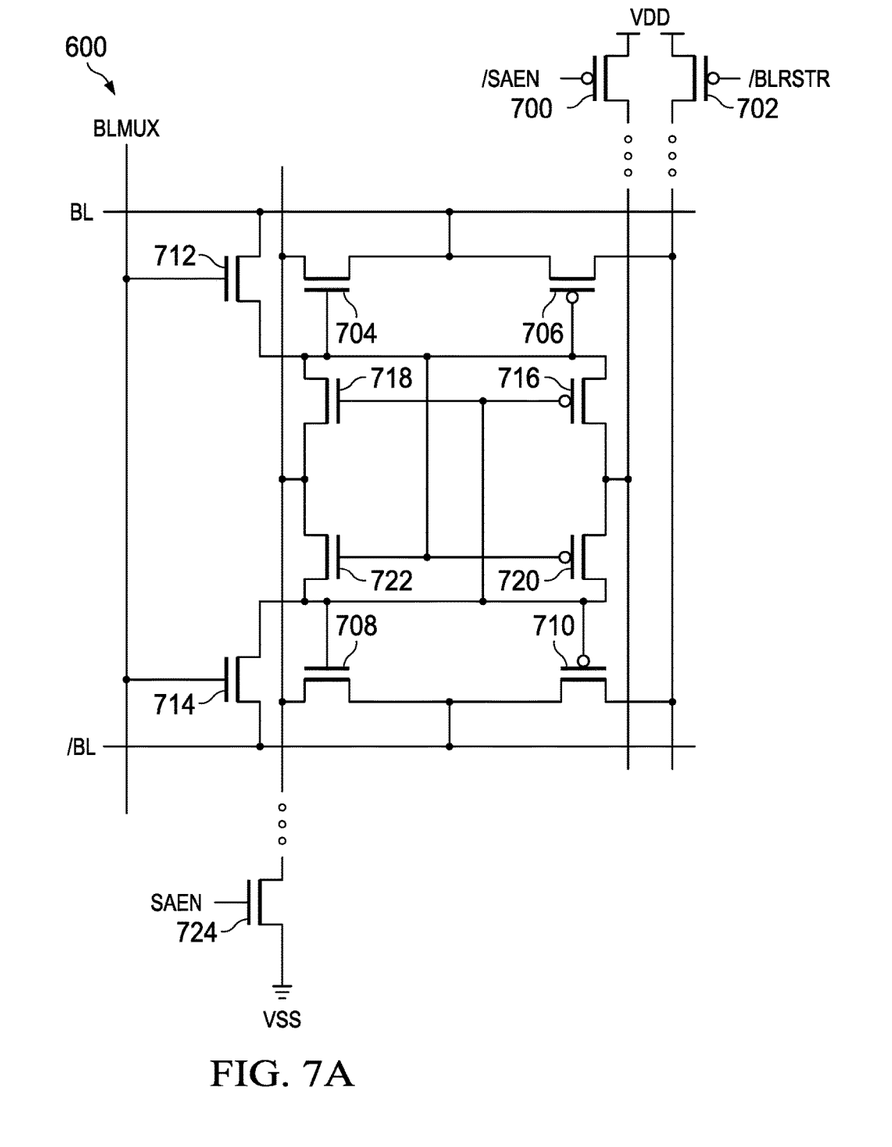
FIG. 7A is a schematic diagram of an inverting sense amplifier circuit of the present invention that may be used with the ferroelectric memory circuits of FIGS. 6A and 6B.

Turning now to FIG. 7A, there is a schematic diagram of an inverting sense amplifier circuit 600 of the present invention that may be used with the ferroelectric memory circuits of FIGS. 6A and 6B. The sense amplifier circuit includes a sense amplifier having P-channel transistors 716 and 720 arranged in a cross-coupled configuration with N-channel transistors 718 and 722. An N-channel sense amplifier enable (SAEN) transistor 724 is coupled between a common source terminal of N-channel transistors 718 and 722 and power supply terminal VSS. A P-channel complementary sense amplifier enable (/SAEN) transistor 700 is coupled between a common source terminal of P-channel transistors 716 and 720 and power supply terminal VDD. N-channel switching transistor 712 is coupled between a common drain terminal of transistors 716 and 718 and bit line BL. N-channel switching transistor 714 is coupled between a common drain terminal of transistors 720 and 722 and complementary bit line /BL. Switching transistors 712 and 714 are controlled by bit line multiplex signal BLMUX. A first inverter, formed by P-channel transistor 706 and N-channel transistor 704, has an input terminal coupled to the common drain terminal of transistors 716 and 718 and an output terminal coupled to bit line BL. A second inverter, formed by P-channel transistor 710 and N-channel transistor 708, has an input terminal coupled to the common drain terminal of transistors 720 and 722 and an output terminal coupled to complementary bit line /BL. The first and second inverters are enabled by P-channel transistor 702 and control signal /BLRSTR together with N-channel transistor 724 and control signal SAEN.

Figure 7B:
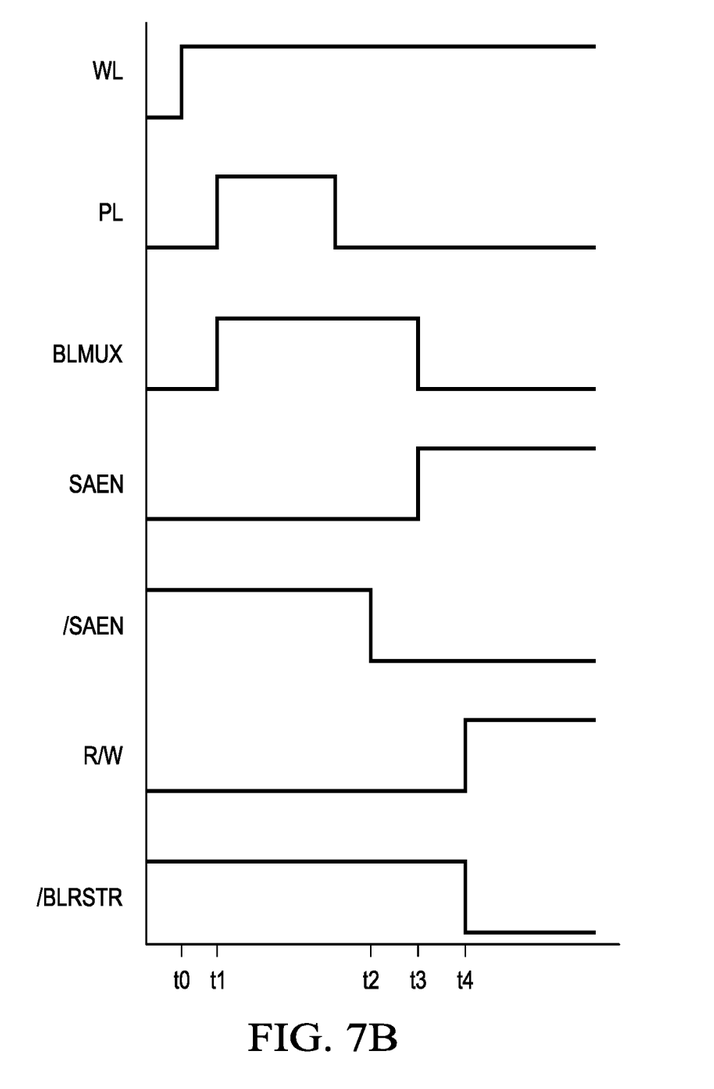
FIG. 7B is a timing diagram showing operation of the inverting sense amplifier circuit of FIG. 7A.

Operation of the inverting sense amplifier circuit 600 of FIG. 7A will now be explained with reference to the timing diagram of FIG. 7B. Initially all signals of FIG. 7B are low except for complementary sense amplifier enable signal /SAEN and complementary bit line restore signal /BLRSTR. Bit lines BL and /BL are precharged to VSS. At time t0, word line WL goes high to select a row of memory cells. Here, word line WL may be any of word lines $WL_0$ through $WL_{N-1}$ of FIG. 6A or 6B. At time t1, plate line signal PL pulses high to read data from a selected memory cell and produce a difference voltage between bit lines BL and /BL. Bit line multiplex signal BLMUX also goes high to turn on switching transistors 712 and 714, thereby coupling bit lines BL and /BL to the sense amplifier. At time t2, when the difference voltage is sufficiently developed at the sense amplifier, complementary sense amplifier enable signal /SAEN goes low to turn on P-channel transistor 700 and apply a positive voltage from power supply VDD to the common source terminal of P-channel transistors 716 and 720. This positive voltage provides some initial amplification of the difference voltage. At time t3, control signal BLMUX goes low to turn off switching transistors 712 and 714, thereby isolating bit lines BL and /BL from the sense amplifier. Sense amplifier enable signal SAEN goes high to turn on N-channel transistor 724 and enable the inverters formed by transistors 704 through 710. N-channel transistor 724 couples the common source terminal of transistors 718 and 722 to power supply terminal VSS, thereby further amplifying the difference voltage at the sense amplifier. At time t4, read/write signal R/W goes high to apply the amplified difference voltage to data lines DL and /DL (FIG. 6A or 6B). Complementary bit line restore signal /BLRSTR goes low to turn on P-channel transistor 702 and apply power supply voltage VDD to the common source terminal of P-channel inverter transistors 706 and 710. Inverters formed by transistors 704 through 710 subsequently write an inverted data signal to the selected memory cell. For example, a memory cell on bit line BL that produced a positive difference voltage with respect to complementary bit line /BL ("1") would be rewritten as a negative voltage on bit line BL with respect to complementary bit line /BL ("0"). This is because the first inverter, formed by transistors 704 and 706, inverts the original data signal on bit line BL. Likewise, the second inverter, formed by transistors 708 and 710, inverts the original data signal on complementary bit line /BL.

The inverting sense amplifier circuit 600 (FIG. 7A) is highly advantageous for several reasons. First, the original data signal read from each memory cell is unconditionally rewritten as an opposite data state. This greatly reduces imprinting within the memory cells by annealing polarized domains of the ferroelectric capacitor. Second, there is no speed penalty in the inverting sense amplifier, since read/write signal R/W is activated as soon as the difference voltage is sufficiently amplified and applied to data lines DL and /DL. Third, the sense amplifier formed by transistors 704 through 710 does not directly restore bit lines BL and /BL. The amplified difference voltage is inverted and driven onto bit lines BL and /BL by respective first (704-706) and second (708-710) inverters. This additional buffering by the first and second inverters reduces the load on the sense amplifier which can, therefore, more easily drive data lines DL and /DL. Finally, since the capacitive load of bit lines (BL, /BL) and data lines (DL, /DL) is divided between the inverters and sense amplifier, respectively, transistor sizes may be reduced so there is only a small area penalty.

Figure 8A:
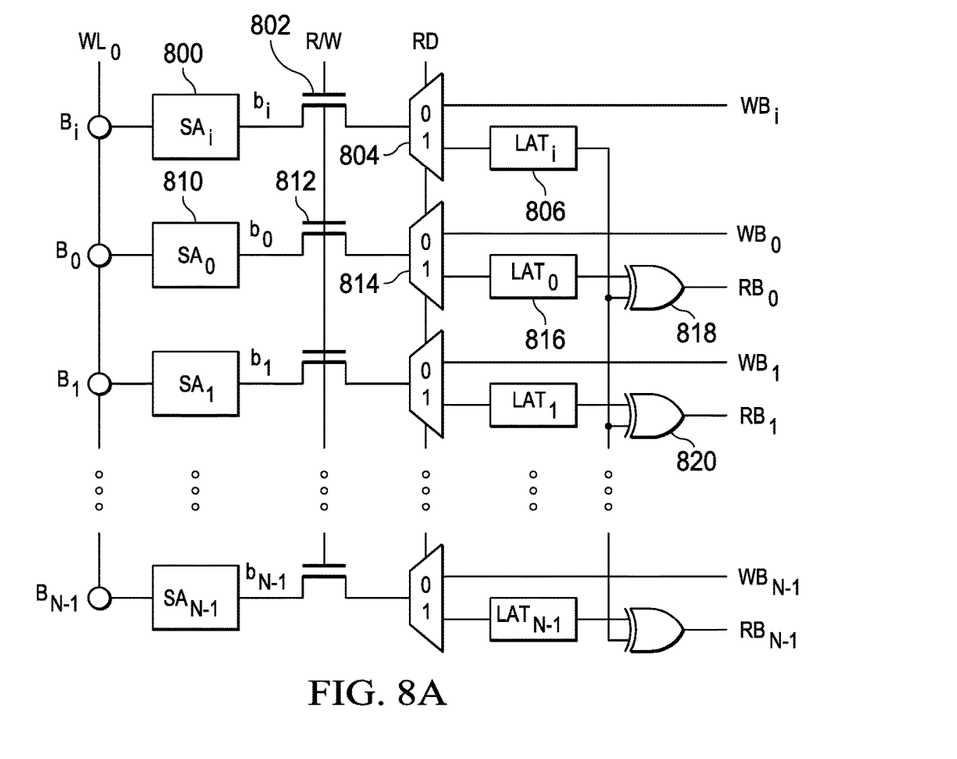
FIG. 8A is a schematic diagram of a memory circuit of the present invention showing conditional inversion of a data word.

Turning now to FIG. 8A, there is a schematic diagram of a memory circuit of the present invention showing conditional inversion of a data word. Recall from the previous discussion that inverting sense amplifier circuit 600 unconditionally inverts data read from a selected memory cell and restores the inverted data to the selected memory cell. It is necessary, therefore, to determine whether data from the inverting sense amplifier is original or inverted data and, responsively, conditionally invert the data. This determination is made by signal bit or inverting bit ($B_i$) as will be explained in detail. The memory circuit of FIG. 8A includes a row of ferroelectric memory cells $B_i$ and $B_0$ through $B_{N-1}$ that are selected by word line $WL_0$. Data from each ferroelectric memory cell is amplified during a read operation by a respective sense amplifier. For example, signal bit $B_i$ is amplified by inverting sense amplifier circuit 800 to produce amplified signal bit $b_i$. Signal bit $b_i$ is applied to multiplex circuit 804 via read/write (R/W) transistor 802. Multiplex circuit 804 subsequently applies signal bit $b_i$ from a respective data line to latch circuit 806 in response to a high level ("1") of control signal RD. Latch circuit 806 latches signal bit $b_i$ and applies it to one terminal of each exclusive OR (XOR) gate corresponding to a data column such as XOR gates 818 and 820. Alternatively, during a write operation write signal bit $WB_i$ is applied through multiplex circuit 804 in response to a low level of control signal RD to read/write transistor 802, sense amplifier circuit 800, and a respective bit line BL or /BL.

Data signals from other ferroelectric memory cells of the row operate in a similar manner. For example, data bit $B_0$ is amplified by inverting sense amplifier circuit 810 to produce amplified data bit $b_0$. Data bit $b_0$ is applied to multiplex circuit 814 via read/write (R/W) transistor 812. Multiplex circuit 814 subsequently applies data bit $b_0$ from a respective data line to latch circuit 816 in response to a high level ("1") of control signal RD. Latch circuit 816 latches data bit $b_0$ and applies it to one terminal of XOR gate 818. Alternatively, during a write operation write data bit $WB_0$ is applied through multiplex circuit 814 in response to a low level of control signal RD to read/write transistor 812, sense amplifier circuit 810, and a respective bit line BL or /BL.

Figure 8B:
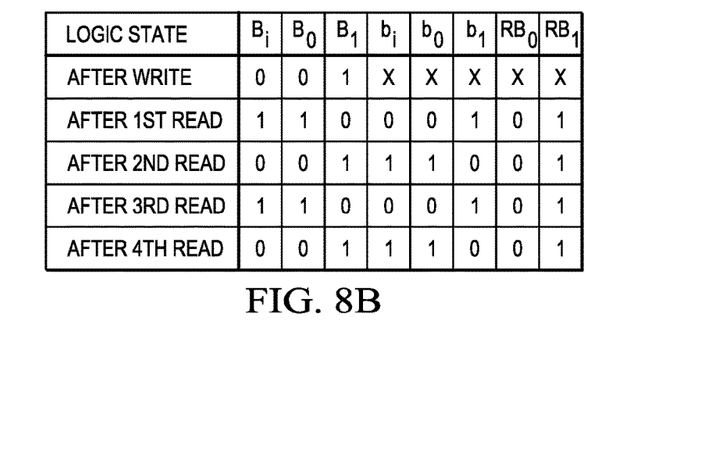
FIG. 8B is a truth table showing operation of the circuit of FIG. 8A.

Operation of the memory circuit of FIG. 8A will now be explained with reference to the truth table of FIG. 8B. The left column of the truth table indicates a previous logical operation such as a READ or WRITE operation. Each row of the truth table shows the logical values of signals identified in FIG. 8A after the logical operation. In particular, the first row indicates initial values after a first write. Signal bit $B_i$ is 0 and data bits $B_0$ and $B_1$ are 01, respectively. Signal bit $b_i$, amplified data bits $b_0$ and $b_1$, and read bits $RB_0$ and $RB_1$ are don't care values as indicated by "X." After a first read operation in the second row, signal bit $b_i$, amplified data bits $b_0$ and $b_1$, and read bits $RB_0$ and $RB_1$ are 00101, respectively. Signal bit $b_i$ has the same value as memory cell signal bit $B_i$ after the initial write operation in the first row. The 0 value of signal bit $b_i$ indicates amplified data bits $b_0$ and $b_1$ (01), are not to be inverted. An XOR of the 0 signal bit $b_i$ with amplified data bits $b_0$ and $b_1$ (01) produces a 01 output at respective XOR gates 818 and 820. Thus, read bits $RB_0$ and $RB_1$ are 01, respectively. Memory cell signal bit $B_i$ and memory cell data bits $B_0$ and $B_1$ in the second row are each rewritten in an inverted state (110) by a respective inverting sense amplifier as previously explained.

After a second read operation in the third row, signal bit $b_i$, amplified data bits $b_0$ and $b_1$, and read bits $RB_0$ and $RB_1$ are 11001, respectively. Signal bit $b_i$ and amplified data bits $b_0$ and $b_1$ have the same value as memory cell signal bit $B_i$ and memory cell data bits $B_0$ and $B_1$ in the second row. These are inverted data states from the original write data of the first row (001). The 1 value of signal bit $b_i$ indicates amplified data bits $b_0$ and $b_1$ (10), must be inverted. An XOR of the 1 signal bit $b_i$ with amplified data bits $b_0$ and $b_1$ (10) produces a 01 output at respective XOR gates 818 and 820. Thus, read bits $RB_0$ and $RB_1$ are 01, respectively. Memory cell signal bit $B_i$ and memory cell data bits $B_0$ and $B_1$ are each rewritten in an inverted state (001) by a respective inverting sense amplifier as previously explained.

The third and fourth read operations are the same as previously explained. In each row, read data bits $RB_0$ and $RB_1$ are 01 as originally written to the memory cell data bits in the first row. Each even-numbered read operation rewrites the original data (001) into the memory cell signal and data bits. Each odd-numbered read, however, rewrites inverted data (110) into the memory cell signal and data bits. As previously discussed, this is highly advantageous for several reasons. First, the original data signal read from each memory cell is unconditionally rewritten as an opposite data state. This greatly reduces imprinting within the memory cells by annealing polarized domains of the ferroelectric capacitor. Second, there is no significant speed penalty in the read path, since the XOR gate is also used to buffer the amplified data bits $b_0$ and $b_1$ in the read data path. The read/write signal R/W is activated as soon as the difference voltage is sufficiently amplified and applied to data lines DL and /DL without additional gate delays. Third, the write data path is unaffected, since a multiplex circuit is required to distinguish between read and write data. Finally, implementation of the present invention is accomplished with minimum additional circuit complexity of the inverting sense amplifier circuit 600 and XOR gates such as 818-820.

Figure 8C:
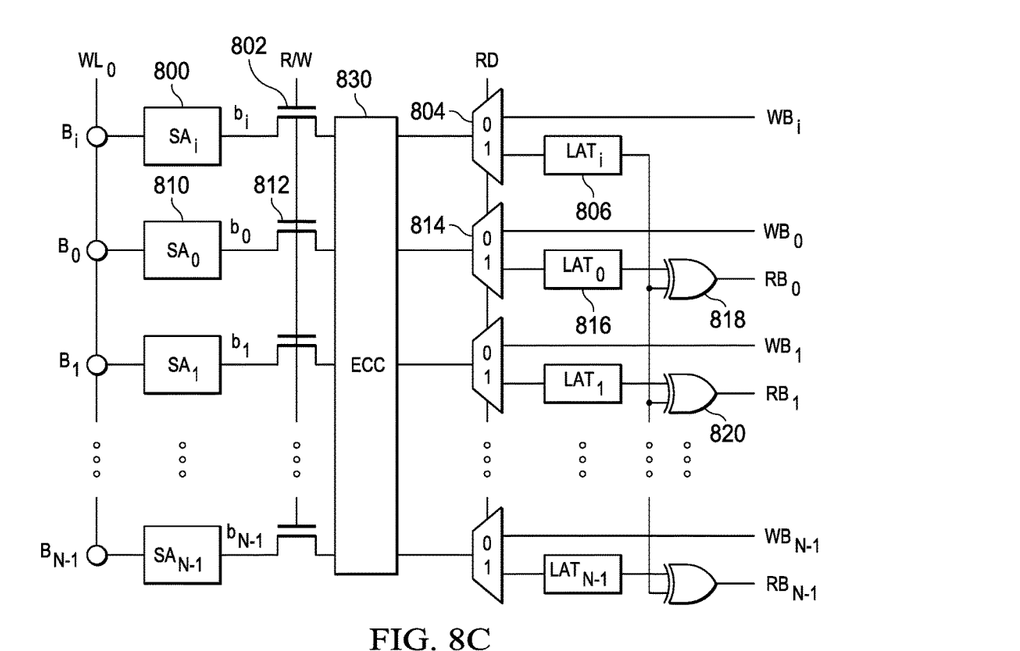
FIG. 8C is a schematic diagram of a memory circuit of the present invention showing conditional inversion of a data word with Error Checking and Correction (ECC)

Referring next to FIG. 8C, there is a schematic diagram of a memory circuit of the present invention showing conditional inversion of a data word with Error Checking and Correction or Error Correction Code (ECC). The circuit is similar to the circuit of FIG. 8A except that ECC circuit 830 is added between read/write transistors such as 802 and 812 and multiplex circuits such as 804 and 814. The ECC circuit may use a single-error correction, double-error detection (SECDED) Hamming code as invented by Richard Hamming in 1950. The Hamming code adds parity bits to the data bits and is very effective for detecting double-bit errors and correcting single-bit errors. The ECC circuit 830 preferably includes a code corresponding to a desired word size. For each valid code word C, there is a valid inverted code word ~C that may be used for SECDED with an inverted data word. Here, a valid code word is one that performs a specific error detection and correction operation such as SECDED on a data word.

Of course, other codes may be used in the ECC circuit to perform SECDED as is known in the art as long as they satisfy the property that both code words C and ~C are valid. Moreover, cyclic error-correcting codes such as BCH codes may be used in ECC circuit 830 to correct multiple bit errors in a single data word such as double-error correction, triple-error detection (DECTED). BCH codes were first invented in 1959 by Alexis Hocquenghem and later independently invented in 1960 by Raj Bose and D. K. Ray-Chaudhuri. The BCH code name is derived from the inventors' initials. BCH codes are well known in the art and are used in satellite communications, compact disk players, DVD, disk drives, solid-state drives, and two-dimensional bar codes.

Figure 9:
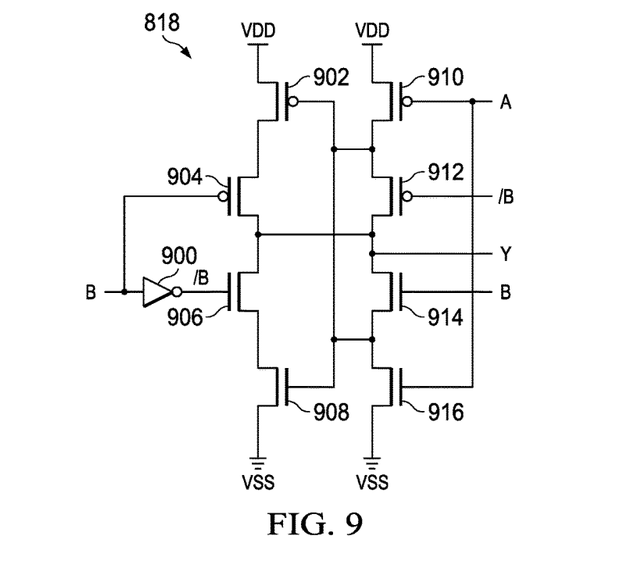
FIG. 9 is a schematic diagram of an exclusive OR (XOR) gate that may be used with the memory circuits of FIGS. 8A and 8C.

Referring now to FIG. 9, there is a schematic diagram of an exclusive OR (XOR) gate 818 that may be used with the memory circuits of FIGS. 8A and 8C. Here, A and B are the two XOR input signals, and Y is the output signal. The XOR gate includes a left branch formed by series-connected transistors 902 through 908 and a right branch formed by series-connected transistors 910 through 916. Inverter 900 receives the B input signal and generates complementary input signal /B. In operation, when input signal B is high, transistors 904 and 906 are both off and disable the left branch. The high state of B and the corresponding low state of /B turn on N-channel transistor 914 and P-channel transistor 912, respectively. The right branch then operates as a simple inverter having input signal A. Thus, when B is high, Y is the inverse of A. Alternatively, when B is low and /B is high, transistors 912 and 914 are both off and disable the right branch. The low state of B and the corresponding high state of /B turn on P-channel transistor 904 and N-channel transistor 906, respectively. Transistors 910 and 916 operate as a first inverter to produce complementary signal /A at the control gate of transistors 902 and 908. Transistors 902 and 908 then operate as a simple inverter having input signal /A. Thus, when B is low, Y is equal to A.

Figure 10:
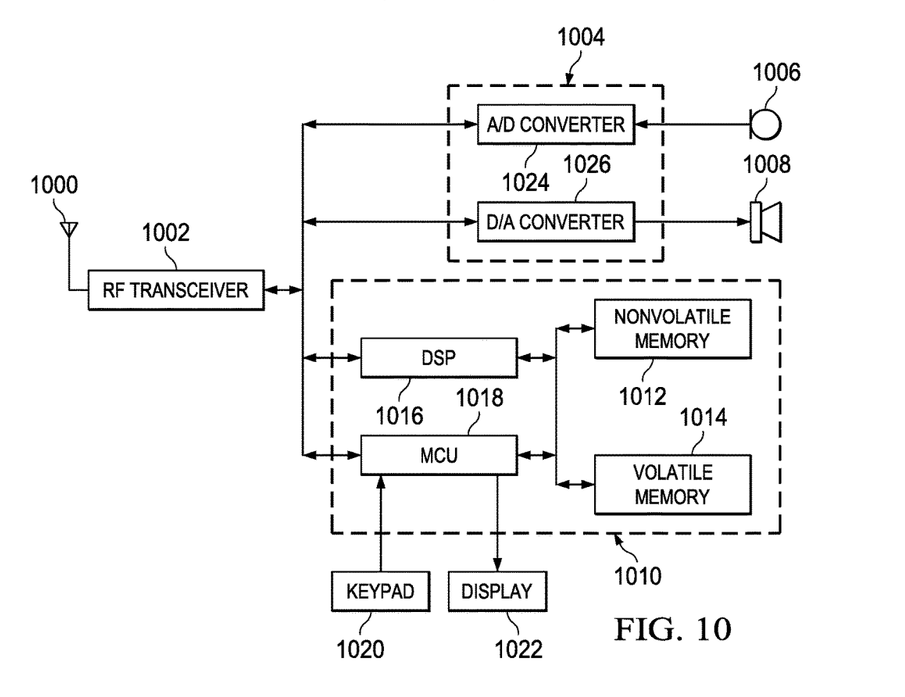
FIG. 10 is a block diagram of a wireless telephone as an example of a portable electronic device which could advantageously employ the present invention.

Referring to FIG. 10, there is a block diagram of a wireless telephone as an example of a portable electronic device which could advantageously employ this invention in a nonvolatile memory array. The wireless telephone includes antenna 1000, radio frequency transceiver 1002, base band circuits 1010, microphone 1006, speaker 1008, keypad 1020, and display 1022. The wireless telephone is preferably powered by a rechargeable battery (not shown) as is well known in the art. Antenna 1000 permits the wireless telephone to interact with the radio frequency environment for wireless telephony in a manner known in the art. Radio frequency transceiver 1002 both transmits and receives radio frequency signals via antenna 1000. The transmitted signals are modulated by the voice/data output signals received from base band circuits 1010. The received signals are demodulated and supplied to base band circuits 1010 as voice/data input signals. An analog section 1004 includes an analog to digital converter 1024 connected to microphone 1006 to receive analog voice signals. The analog to digital converter 1024 converts these analog voice signals to digital data and applies them to digital signal processor 1016. Analog section 1004 also includes a digital to analog converter 1026 connected to speaker 1008. Speaker 1008 provides the voice output to the user. Digital section 1010 is embodied in one or more integrated circuits and includes a microcontroller unit 1018, a digital signal processor 1016, nonvolatile memory circuit 1012, and volatile memory circuit 1014. Nonvolatile memory circuit 1012 may include read only memory (ROM), ferroelectric memory (FeRAM or FRAM), FLASH memory, or other nonvolatile memory as known in the art. Volatile memory circuit 1014 may include dynamic random access memory (DRAM), static random access memory (SRAM), or other volatile memory circuits as known in the art. Microcontroller unit 1018 interacts with keypad 1020 to receive telephone number inputs and control inputs from the user. Microcontroller unit 1018 supplies the drive function to display 1022 to display numbers dialed, the current state of the telephone such as battery life remaining, and received alphanumeric messages. Digital signal processor 1016 provides real time signal processing for transmit encoding, receive decoding, error detection and correction, echo cancellation, voice band filtering, etc. Both microcontroller unit 1018 and digital signal processor 1016 interface with nonvolatile memory circuit 1012 for program instructions and user profile data. Microcontroller unit 1018 and digital signal processor 1016 also interface with volatile memory circuit 1014 for signal processing, voice recognition processing, and other applications.

Still further, while numerous examples have thus been provided, one skilled in the art should recognize that various modifications, substitutions, or alterations may be made to the described embodiments while still falling with the inventive scope as defined by the following claims. For example, the present invention may be applied to any memory circuit such as static random access memory circuits, resistive random access memory circuits, magnetic random access memory circuits, or any other memory circuit that may develop a biased signal margin after multiple asymmetric read or write operations. Other combinations will be readily apparent to one of ordinary skill in the art having access to the instant specification.

What is claimed is:

1. A memory device comprising:
   a memory array that includes a first memory cell coupled to a first bit line and a second memory cell coupled to a second bit line; and
   a sense amplifier that includes:
      first and second transistors arranged in a cross-coupled configuration with third and fourth transistors, the first and second transistors being of a first conductivity type and the third and fourth transistors being of a second conductivity type;
      a first inverter having an input coupled to a first common drain terminal of the first and third transistors and an output coupled to the first bit line, the first inverter including fifth and sixth transistors coupled in series between a first control signal line and a second control signal line, one of the fifth and sixth transistors being of the first conductivity type and the other of the fifth and sixth transistors being of the second conductivity type; and a second inverter having an input coupled to a second common drain terminal of the second and fourth transistors and an output coupled to the second bit line, the second inverter including seventh and eighth transistors coupled in series between the first control signal line and the second control signal line, one of the seventh and eighth transistors being of the first conductivity type and the other of the seventh and eighth transistors being of the second conductivity type;

wherein the sense amplifier is configured to:

in response to a read operation, amplify a difference voltage between a first data signal on the first bit line and a second data signal on the second bit line; and after amplifying the difference voltage, activate the first and second inverters in response to a reference voltage being supplied to the first control signal line and a supply voltage being supplied to the second control signal line to invert the first data signal on the first bit line and invert the second data signal on the second bit line.

2. The memory device of claim 1, wherein the first conductivity type is n-type and the second conductivity type is p-type, and wherein the first and second transistors are n-channel transistors and the third and fourth transistors are p-channel transistors.

3. The memory device of claim 1, comprising:
a first switching transistor coupled between the first bit line and the first common drain terminal; and
a second switching transistor coupled between the second bit line and the second common drain terminal.

4. The memory device of claim 3, wherein the first and second switching transistors are of the first conductivity type.

5. The memory device of claim 1, wherein:
a gate terminal of the fifth transistor and a gate terminal of the sixth transistor are each coupled to the first common drain terminal; and
a gate terminal of the seventh transistor and a gate terminal of the eighth transistor are each coupled to the second common drain terminal.

6. The memory device of claim 1, wherein a data state indicated by the inverted first data signal is written to the first memory cell and a data state indicated by the inverted second data signal is written to the second memory cell prior to completion of the read operation.

7. The memory device of claim 6, wherein the memory array comprises a ferroelectric memory array.

8. The memory device of claim 7, wherein the first and second memory cells each include an access transistor and a ferroelectric capacitor, the first and second memory cells being part of a two-transistor, two-capacitor (2T-2C) ferroelectric memory cell of the ferroelectric memory array.

9. The memory device of claim 8, comprising:
a first word line coupled to each access transistor of the 2T-2C ferroelectric memory cell; and
a first plate line coupled to each ferroelectric capacitor of the 2T-2C ferroelectric memory cell.

10. The memory device of claim 7, wherein the first and second memory cells each include an access transistor and a ferroelectric capacitor, the first memory cell being a first one-transistor, one capacitor (1T-1C) ferroelectric memory cell of the ferroelectric memory array and the second memory cell being a second 1T-1C ferroelectric memory cell of the ferroelectric memory array.

11. The memory device of claim 10, comprising:
a first word line coupled to a first access transistor of the first 1T-1C ferroelectric memory cell;
a second word line coupled to a second access transistor of the second 1T-1C ferroelectric memory cell; and
a first plate line coupled to the ferroelectric capacitor of the first 1T-1C ferroelectric memory cell and the ferroelectric capacitor of the second 1T-1C ferroelectric memory cell.

12. The memory device of claim 1, wherein the first and second bit lines are complementary bit lines.

13. A memory device comprising:
a memory array that includes a first memory cell coupled to a first bit line and a second memory cell coupled to a second bit line; and
a sense amplifier that includes:
first and second transistors arranged in a cross-coupled configuration with third and fourth transistors, the first and second transistors being of a first conductivity type and the third and fourth transistors being of a second conductivity type;
a first inverter having an input coupled to a first common drain terminal of the first and third transistors and an output coupled to the first bit line, the first inverter including fifth and sixth transistors coupled in series between a first control signal line and a second control signal line, one of the fifth and sixth transistors being of the first conductivity type and the other of the fifth and sixth transistors being of the second conductivity type, and wherein a gate terminal of the fifth transistor and a gate terminal of the sixth transistor are each coupled to the first common drain terminal; and
a second inverter having an input coupled to a second common drain terminal of the second and fourth transistors and an output coupled to the second bit line, the second inverter including seventh and eighth transistors coupled in series between the first control signal line and the second control signal line, one of the seventh and eighth transistors being of the first conductivity type and the other of the seventh and eighth transistors being of the second conductivity type, and wherein a gate terminal of the seventh transistor and a gate terminal of the eighth transistor are each coupled to the second common drain terminal.

14. The memory device of claim 13, wherein the sense amplifier is configured to:
in response to a read operation, amplify a difference voltage between a first data signal on the first bit line and a second data signal on the second bit line; and
after amplifying the difference voltage, activate the first and second inverters in response to a reference voltage being supplied to the first control signal line and a supply voltage being supplied to the second control signal line to invert the first data signal on the first bit line and invert the second data signal on the second bit line.

15. The memory device of claim 14, wherein a data state indicated by the inverted first data signal is written to the first memory cell and a data state indicated by the inverted second data signal is written to the second memory cell prior to completion of the read operation.

16. The memory device of claim 13, comprising:
a first switching transistor coupled between the first bit line and the first common drain terminal; and
a second switching transistor coupled between the second bit line and the second common drain terminal.

17. The memory device of claim 13, wherein:
the gate terminal of the fifth transistor and the gate terminal of the sixth transistor are each also coupled to a gate terminal of the second transistor and a gate terminal of the fourth transistor; and
the gate terminal of the seventh transistor and the gate terminal of the eighth transistor are each also coupled to a gate terminal of the first transistor and a gate terminal of the second transistor.

18. An electronic system comprising:
a memory to store instructions; and
a processor to execute the instructions stored by the memory, wherein the memory includes:
a memory array having a first memory cell coupled to a first bit line and a second memory cell coupled to a second bit line; and
a sense amplifier having:
first and second transistors arranged in a cross-coupled configuration with third and fourth transistors, the first and second transistors being of a first conductivity type and the third and fourth transistors being of a second conductivity type;
a first inverter having an input coupled to a first common drain terminal of the first and third transistors and an output coupled to the first bit line, the first inverter including fifth and sixth transistors coupled in series between a first control signal line and a second control signal line, one of the fifth and sixth transistors being of the first conductivity type and the other of the fifth and sixth transistors being of the second conductivity type; and
a second inverter having an input coupled to a second common drain terminal of the second and fourth transistors and an output coupled to the second bit line, the second inverter including seventh and eighth transistors coupled in series between the first control signal line and the second control signal line, one of the seventh and eighth transistors being of the first conductivity type and the other of the seventh and eighth transistors being of the second conductivity type;
wherein the sense amplifier is configured to, in response to a read operation, amplify a difference voltage between a first data signal on the first bit line and a second data signal on the second bit line, and, after amplifying the difference voltage, activate the first and second inverters in response to a reference voltage being supplied to the first control signal line and a supply voltage being supplied to the second control signal line to invert the first data signal on the first bit line and invert the second data signal on the second bit line.

19. The electronic device of claim 18, comprising:
a first switching transistor coupled between the first bit line and the first common drain terminal; and
a second switching transistor coupled between the second bit line and the second common drain terminal.

20. The electronic device of claim 18, wherein:
a gate terminal of the fifth transistor and a gate terminal of the sixth transistor are each coupled to the first common drain terminal, a gate terminal of the second transistor, and a gate terminal of the fourth transistor; and
a gate terminal of the seventh transistor and a gate terminal of the eighth transistor are each coupled to the second common drain terminal, a gate terminal of the first transistor, and a gate terminal of the third transistor.

* * * * *